US010038307B2

(12) United States Patent
Maulini et al.

(10) Patent No.: US 10,038,307 B2
(45) Date of Patent: Jul. 31, 2018

(54) QUANTUM CASCADE LASER OPTIMIZED FOR EPITAXIAL SIDE-DOWN MOUNTING

(71) Applicant: Alpes Lasers SA, St-Blaise (CH)

(72) Inventors: Richard Maulini, Marin-Epagnier (CH); Alfred Bismuto, San Jose, CA (US); Tobias Gresch, Lausanne (CH); Antoine Müller, Neuchatel (CH)

(73) Assignee: Alpes Lasers SA, St-Blaise (CH)

( * ) Notice: Subject to any disclaimer, the term of this patent is extended or adjusted under 35 U.S.C. 154(b) by 0 days.

(21) Appl. No.: 15/534,605

(22) PCT Filed: Dec. 19, 2014

(86) PCT No.: PCT/IB2014/002852
§ 371 (c)(1),
(2) Date: Jun. 9, 2017

(87) PCT Pub. No.: WO2016/097780
PCT Pub. Date: Jun. 23, 2016

(65) Prior Publication Data
US 2017/0324220 A1    Nov. 9, 2017

(51) Int. Cl.
*H01L 21/00* (2006.01)
*H01S 5/34* (2006.01)
(Continued)

(52) U.S. Cl.
CPC ............ *H01S 5/3402* (2013.01); *H01S 5/026* (2013.01); *H01S 5/0224* (2013.01);
(Continued)

(58) Field of Classification Search
CPC .. H01S 5/3402; H01S 5/0425; H01S 5/34313; H01S 5/026; H01S 5/02272; H01S 5/0224; H01S 5/227
(Continued)

(56) References Cited

U.S. PATENT DOCUMENTS 5,198,686 A * 3/1993 Yoshimura .......... H01L 33/0062
257/13
2008/0075133 A1    3/2008 Day et al.
(Continued)

FOREIGN PATENT DOCUMENTS

JP            05-67847 A      3/1993
JP       2004-140141 A        5/2004

OTHER PUBLICATIONS

Gmachl C et al: "Improved CW operation of quantum cascade lasers with epitaxial-side heat-sinking", IEEE Photonics Technology Letters, IEEE Service Center, Piscataway, NJ, US, vol. 11, No. 11, Nov. 1, 1999 (Nov. 1, 1999), pp. 1369-1371, XP011431821 (previously listed on IDS filed on Jun. 9, 2017).
(Continued)

*Primary Examiner* — Vu A Vu
(74) *Attorney, Agent, or Firm* — Renner, Otto, Boisselle & Sklar, LLP

(57) ABSTRACT

For epitaxial-side-down bonding of quantum cascade lasers (QCLs), it is important to optimize the heat transfer between the QCL chip and the heat sink to which the chip is mounted. This is achieved by using a heatsink with high thermal conductivity and by minimizing the thermal resistance between the laser active region and said heatsink. In the epi-down configuration concerned, the active region of the QCL is located only a few micrometers away from the heatsink, which is preferable from a thermal standpoint. However, this design is challenging to implement and often results in a low fabrication yield if no special precautions are taken. Since the active region is very close to the heatsink, solder material may ooze out on the sides of the chip during the bonding process and may short-circuits the device, rendering it unusable. To avoid this happening, the invention proposes to provide a trench all around the chip with the exception of the two waveguide facets, i.e. the ends of the
(Continued)

active region. This trench may be etched into the otherwise standard QCL chip or otherwise machined into the chip, providing an initially empty space for the volume of solder displaced by the chip during the epi-down bonding process, which empty space is occupied by the surplus solder without contacting the side of the chip and thus short-circuiting the device.

8 Claims, 4 Drawing Sheets

(51) Int. Cl.
H01S 5/022 (2006.01)
H01S 5/227 (2006.01)
H01S 5/026 (2006.01)
H01S 5/042 (2006.01)
H01S 5/343 (2006.01)
H01S 5/024 (2006.01)

(52) U.S. Cl.
CPC ........ H01S 5/02272 (2013.01); H01S 5/0425 (2013.01); H01S 5/227 (2013.01); H01S 5/2272 (2013.01); H01S 5/34313 (2013.01); H01S 5/02476 (2013.01)

(58) Field of Classification Search
USPC .......................................................... 438/47
See application file for complete search history.

(56) References Cited

U.S. PATENT DOCUMENTS

2011/0249694 A1  10/2011 Nishiguchi
2013/0182736 A1*  7/2013 Hashimoto ............. H01S 5/343
                                                   372/45.012
2013/0243020 A1*  9/2013 Kim ...................... H01S 5/0224
                                                   372/36

OTHER PUBLICATIONS

A. Tsekoun et al: "Improved performance of quantum cascade lasers through a scalable, manufacturable epitaxial-side-down mounting process", Proceedings of the National Academy of Sciences, vol. 103, No. 13, Mar. 28, 2006 (Mar. 28, 2006), pp. 4831-4835, XP055215738 (previously listed on IDS filed on Jun. 9, 2017).
International Search Report for corresponding International Application No. PCT/IB2014/002852 dated Oct. 9, 2015.
Gmachl C et al: "Improved CW operation of quantum cascade lasers with epitaxial-side heat-sinking", IEEE Photonics Technology Letters, IEEE Service Center, Piscataway, NJ, US, vol. 11, No. 11, Nov. 1, 1999 (Nov. 1, 1999), pp. 1369-1371, XP011431821.
A. Tsekoun et al: "Improved performance of quantum cascade lasers through a scalable, manufacturable epitaxial-side-down mounting process", Proceedings of the National Academy of Sciences, vol. 103, No. 13, Mar. 28, 2006 (Mar. 28, 2006), pp. 4831-4835, XP055215738.

* cited by examiner

Prior Art

Prior Art

QUANTUM CASCADE LASER OPTIMIZED FOR EPITAXIAL SIDE-DOWN MOUNTING

BACKGROUND AND PRIOR ART

This invention relates to quantum cascade semiconductor lasers, focusing in particular on thermal management and fabrication yield of such lasers.

Quantum cascade lasers (QCLs) are semiconductor lasers relying on intersubband transitions in quantum wells. They operate in continuous-wave (CW) mode at room temperature in the mid-infrared spectral range, i.e. at wavelengths of 3-50 µm.

Because QCLs operate at relatively large voltages of about 10 V and threshold current densities of the order of 1 kA/cm$^2$, Joule heating in the gain region leads to a significant rise of internal temperature above heat-sink temperature during high-duty-cycle and CW operation. This self-heating generally results in performance degradation, as the laser efficiency decreases with increasing active region temperature. To keep this detrimental effect to a minimum, it is important to optimize heat transfer by using a heat-sink made of a high thermal conductivity material and by minimizing thermal resistance between the laser active region and said heat-sink.

The fabrication of QCLs, like most semiconductor lasers, starts by epitaxial growth of a semiconductor heterostructure on a substrate. The epitaxial side is then patterned to form a waveguide, an electrically insulating layer is deposited and selectively opened, and metallic layers are deposited for electrical contacting. An additional gold layer, typically 3-5 µm, is often electroplated on top of the contact layer to enhance heat dissipation by spreading heat laterally. The substrate side is thinned down to typically 100-200 µm and a metallic contact layer is deposited on it. For the device to emit light, current must flow between the epitaxial-side and the substrate-side contacts through the active region.

FIGS. 1a and 1b illustrate the two main classes of corresponding device geometries: FIG. 1a shows the first class, a ridge-waveguide (RWG) laser in which a thin layer of dielectric material, typically silicon nitride ($Si_3N_4$) or silicon oxide ($SiO_2$), is used as insulator. The second class, a buried-heterostructure (BH) laser is shown in FIG. 1b, wherein a selective overgrowth of semi-insulating semiconductor material, typically iron-doped InP (Fe:InP), is used as insulator. The latter has the advantages of lower waveguide losses and higher thermal conductivity. FIGS. 1a and 1b are described in detail further down.

Of the buried heterostructure (BH) configurations mentioned above, at least two different types have been demonstrated for QCLs, which we will call here "standard BH" and "inverted BH". In the standard BH, a planar top cladding is grown first, a ridge is then etched in the top cladding and active region, and finally semi-insulating material is selectively overgrown on the sides of said ridge to complete the waveguide.

FIG. 2 shows a so-called "inverted" BH QCL as described by A. Bismuto et al. in the yet unpublished European Patent Application 13 405 109.3, filed 13 Sep. 2013. In this structure, a ridge is etched in the active region 14 prior to growing the cladding, semi-insulating material 15 is then selectively overgrown on the sides of the active region 14, and finally a planar top cladding 16 is grown over the entire structure to complete the waveguide. A metallic top contact layer 13 on an optional insulating layer 12, together with a not shown contact layer on the back of the substrate 17, provides the electrical energy to the QCL.

This device is called an "inverted BH QCL" because the order of carrying out the top cladding growth and selective overgrowth is inverted compared to the standard BH process. This inverted BH architecture has the advantage of requiring a thinner selective overgrowth, typically about 2-3 µm, than the standard architecture, typically about 6-7 µm.

QCL chips can be mounted either epitaxial-side-up ("epi-up") or epitaxial-side-down ("epi-down"). Both the RWG and BH configurations are well suited for epi-up bonding. The BH configuration, with its flat top surface, is also naturally well suited for epi-down bonding. In the case of the RWG configuration, the double-channel, or double-trench, geometry as described by J. S. Yu et al. in "High-power λ~9.5 µm quantum-cascade lasers operating above room temperature in continuous-wave mode", Applied Physics Letters 88, 091113 (2006), where the waveguide is defined by etching two narrow channels, as shown in FIG. 3, is typically used for epi-down bonding.

In the epi-up configuration, the substrate side is soldered onto a heat-sink made of a high-thermal-conductivity material, e.g. copper using an electrically conductive solder material, typically indium (In) or gold-tin (AuSn). This bonding process typically results in a high fabrication yield, because a thick layer of solder material can be used without risking to short-circuit the device. However, the resulting thermal resistance is large because the heat generated in the active region has to cross the whole thickness of the substrate (>100 µm), which typically has a much lower thermal conductivity (68 W/mK for InP) than the heat-sink (401 W/mK for Cu).

In the epi-down configuration, on the other hand, the active region is located only a few microns away from the heat-sink, resulting in a much lower thermal resistance. Nevertheless, even though this configuration is preferable from a thermal standpoint, it is not always chosen by QCL manufacturers because it is more challenging to implement and often results in a lower fabrication yield if no special precautions are taken. This is because the active region is very close to the heat-sink and therefore solder material may ooze out on the sides of the chip during the bonding process which readily short-circuits the device, rendering it unusable.

To minimize the probability of short-circuiting devices during the epi-down bonding process, solder thickness needs to be kept low, typically only a few microns. Therefore, solder material has to be placed on the heat-sink using a vacuum deposition process. While it helps avoiding short circuits, using a thin solder layer thickness increases requirements on surface planarity: the presence of micron-sized protrusions or of curvature due to mechanical strain can prevent solder from wetting the whole surface and, thus, results in a poor thermal contact between chip and heat-sink. A trade-off between these two effects, which are both detrimental to fabrication yield, has to be found.

Even with a thin vacuum-deposited solder layer, the risk of shorting devices during epi-down bonding is still present. Since the chip surface is flat and pressure needs to be applied during the process, molten solder tends to flow outwards, towards the sides of the chip and to ooze out. As the sides of the chip are not electrically insulated, a small accumulation of solder which comes into contact with the substrate above the active region is sufficient to create a short circuit.

Kim et al. describe in US 2013/0243020 A1, Epitaxial-side-down mounted high-power semiconductor lasers, a configuration for epi-down bonding of RWG semiconductor lasers. In this scheme, the laser ridge is free-standing and posts of approximately the same height as the ridge are located on the both sides to provide mechanical stability and flatness of the bond. The empty volume between the ridge and posts provides a relief area for excess solder.

While the approach described reduces the probability of shorting devices during the epi-down bonding process, it has the drawback of significantly reducing the contact area between the chip and a heatsink, particularly in comparison to the double-channel RWG and BH configurations. Indeed, only the typically 1-50 μm wide RWG and the posts, which are typically square with a length of 20-100 μm on a side and separated by free space of typically 100-1000 μm, get soldered onto the heatsink. This only represents a small fraction of the total chip area. Consequently, mechanical robustness of the bond, which is usually quantified by its die shear strength value, is significantly reduced, so is the heat transfer from the chip to the heatsink.

The present invention overcomes this disadvantage because the solder relief trench according to the invention typically represents less than 20% of the total chip area. The chip is thus soldered onto the heat-sink over more than 80% of its area, resulting in higher die shear strength. In addition, the larger contact area results in an improved thermal conductivity, particularly in the BH configuration in which lateral heat dissipation is significant.

BRIEF SUMMARY OF THE INVENTION

The purpose of this invention is to overcome the problem of electrical shorting of quantum cascade lasers chips during epitaxial-side-down bonding.

As mentioned above, QCL chips get short-circuited during the mounting process because molten solder oozes or seeps out on the sides and gets into contact with the substrate above the active region. One possible way to eliminate this failure mode is to prevent solder from oozing out by providing relief areas where excess solder can flow without risking to create a short circuit.

The present invention provides such a relief area by etching a trench all around the chip, with the exception of the laser facets. This way, excess solder which is pushed towards the sides of the flat center area during the epi-down bonding process accumulates in this trench and does not ooze out of the chip. This approach is compatible with both RWG and BH configurations.

More details of the invention may be perceived from the following description of several embodiments of the invention, from the drawings, and from the appended claims.

BRIEF DESCRIPTION OF THE DRAWINGS

The appended drawings show in.

DETAILED DESCRIPTION OF THE INVENTION

Embodiments of the invention are described subsequently in the form of improved RWG, standard BH, and inverted BH QCLs configured for epi-down mounting. It is understood that the present invention can be embodied in various forms. Thus, the embodiments described here are only examples and one skilled in the art may utilize other embodiments without departing from the scope of the present invention.

Figure 1A:
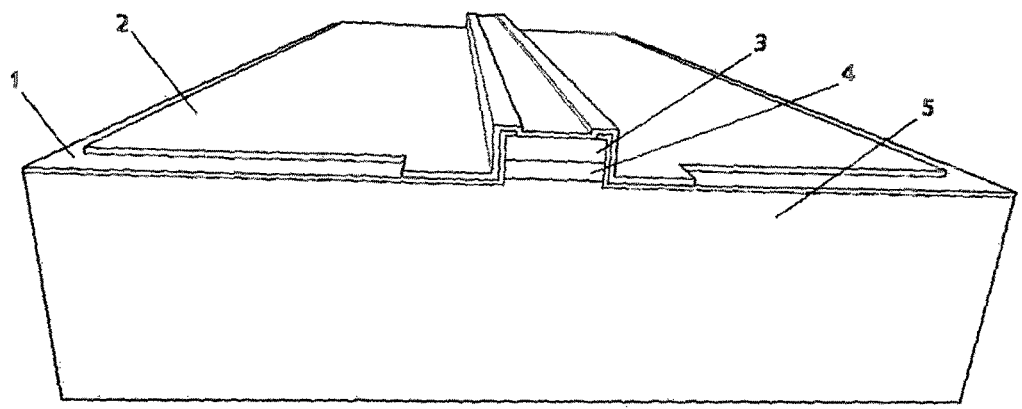
FIG. 1a a prior art ridge waveguide (RWG) QCL design,
FIG. 1b a prior art buried heterostructure (BH) QCL design,
FIG. 2 a prior art "inverted" BH QCL design,
FIG. 3 a prior art "double-channel" RWG QCL,
FIG. 4 a first embodiment of the invention, a BH QCL,
FIG. 5 a second embodiment of the invention, an inverted BH QCL,
FIG. 6 a third embodiment of the invention, an RWG QCL,
FIG. 7 an output/current diagram of an embodiment of the invention.

FIG. 1a, as mentioned above, shows a conventional, i.e. prior art, ridge waveguide (RWG) semiconductor laser. A narrow active region 4, extending along the length of the laser body and covered by a top cladding 3, is located on a substrate 5. An insulating layer 1 on this substrate 5 with an opening on top of the cladding 3 is covered by a metallic layer 2 serving as one electrical contact for the active region 4. The other contact, usually at the bottom of the substrate 5, is not shown in FIG. 1a.

Figure 1B:
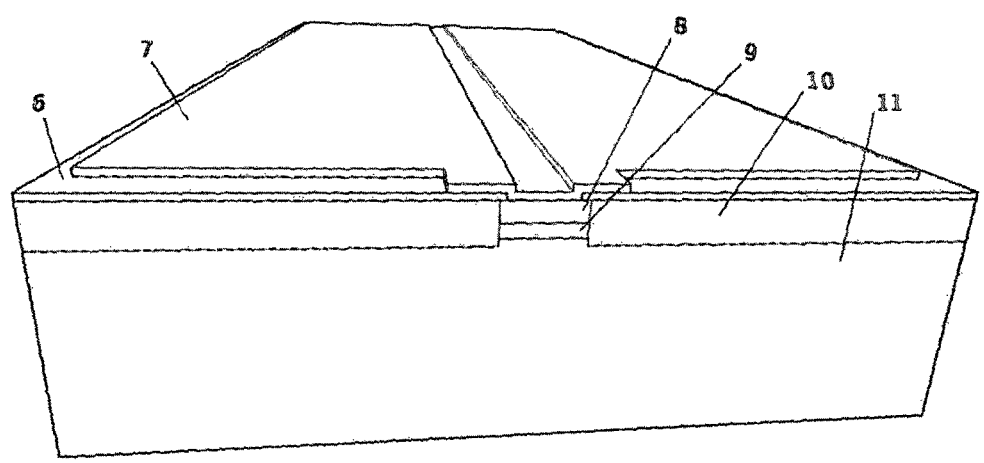

FIG. 1b shows a typical prior art buried heterostructure (BH) laser. A substrate 11 carries an active region 9 with a top cladding 8 extending along the length of the laser structure. Both active region 9 and top cladding 8 are embedded in a semi-insulating lateral overgrowth 10 serving as lateral confining or blocking element. An optional insulating layer 6 may cover the latter, leaving a contact area on top of the cladding 8 open. A top contact layer 7 provides one electrical contact for the active region, the opposite contact, usually at the bottom of the substrate 11, is not shown.

Typical materials for these lasers include III-V materials or compounds, such as InP for the substrate, InGaAs and AlInAs for the active region, InP and/or a ternary such as doped InAlAs or InGaAs for the cladding and Fe-doped InP or InGaAs for the lateral confining or burying layers. The top and bottom electrodes usually consist of several layers, the last one of which is typically Au.

Figure 2:
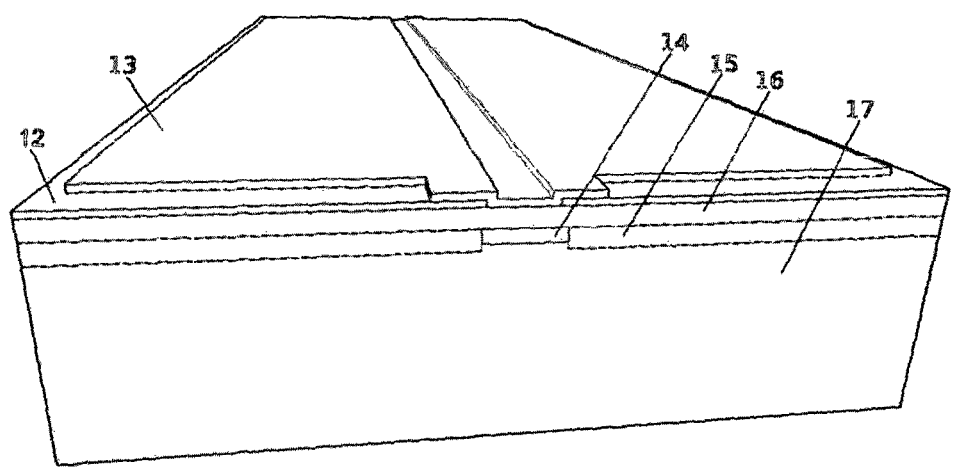

FIG. 2 is already addressed above, depicting an "inverted" BH QCL as shown and described in the yet unpublished European Patent Application 13 405 109.3 by A. Bismuto et al., filed 13 Sep. 2013, also mentioned above.

Figure 3:
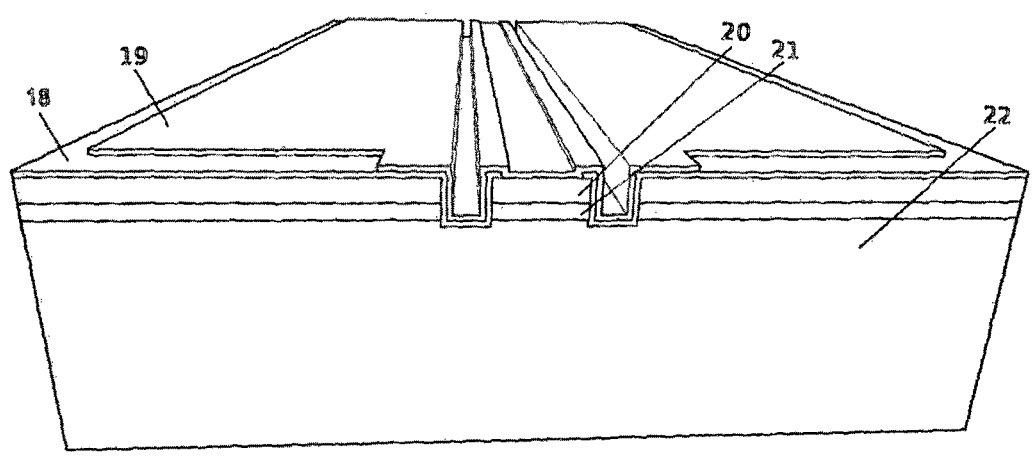

FIG. 3, also briefly addressed above, displays a prior art RWG configuration with a double-channel, or double-trench, geometry as described by J. S. Yu et al. in "High-power λ~9.5 μm quantum-cascade lasers operating above room temperature in continuous-wave mode", Applied Physics Letters 88, 091113 (2006). In this QCL, two narrow channels are etched down to the substrate 22, defining a waveguide for the active region 21 and the top cladding 20. An insulating layer 18 covers the whole structure except for a strip on top of the cladding 20. A metallic layer 19 on top of this insulating layer 18 serves as one contact for current injection into the QCL's active region. The opposite contact, usually at the bottom of substrate 22, is not shown in FIG. 3.

Figure 4:
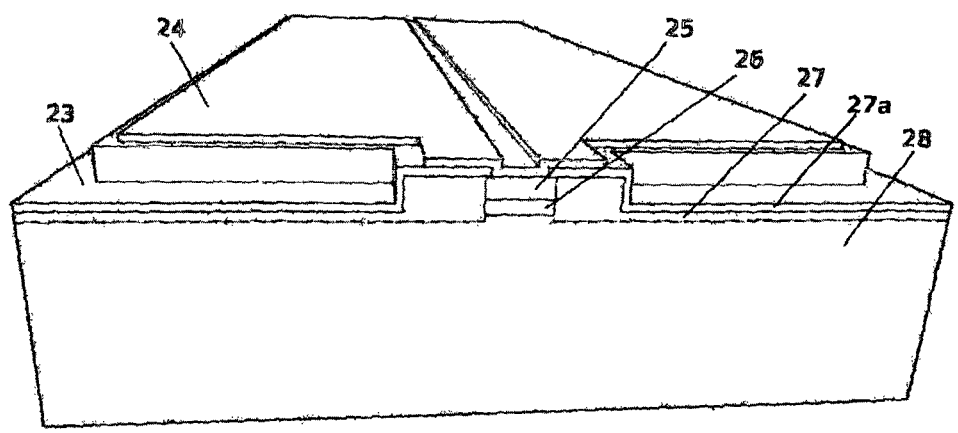

FIG. 4 now shows a first embodiment of the invention in form of a "standard" BH QCL, i.e. a QCL starting from the design shown in FIG. 1a, modified according to the present invention. This standard BH QCL has, on a substrate 28, an active region 26 with a top cladding 25 on it, a semi-insulating lateral overgrowth or burying layer 27 on top with a metallic layer 24 as contact for current injection. Optionally, an insulating layer 27a with an opening along the ridge may be provided under this metallic layer 24. The opposite contact, usually at the bottom of the substrate 28, is not shown. The new structural element according to the invention is the trench 23, serving as solder relief space, extending all around the chip with the exception of the laser facets. This trench 23 is etched into the semi-insulating overgrowth or burying layer 27 covering the whole QCL chip, shown as thick burying layer 5 in FIG. 1b. This trench 23 creates a relief space where excess molten solder can flow during the chip mounting process without risking to short the device.

The epitaxial side of this QCL chip consists of a stripe of active region 26 and cladding 25, which constitutes the core of the waveguide, sandwiched between selectively overgrown semi-insulating semiconductor material, e.g. Fe-doped InP, as burying layer 27. The optional top layer 27a of electrically insulating dielectric material, such as SiN and/or SiO, is open above the active region to provide electrical contact. This layer 27a is not always necessary for BH QCLs, because the burying layer 27 is semi-insulating and thus provides some electrical insulation. However, it is sometimes used as an additional safety measure to prevent possible leakage current in the burying layer. The top surface also comprises the metallic contact 24 and, optionally, a layer of heat-spreading material such as a relatively thick, typically 3-5 μm, electro-plated Au layer. The trench 23 is etched all around the chip with the exception of two typically 50 μm-wide sections centered on the extremities, i.e. facets of the waveguide.

Leaving about 20 μm of unetched material on both sides of the active region near the facets ensures that the optical mode, which extends into the lateral overgrowth, is not disturbed, and that the heat produced by the segment of the active region close to the facets is efficiently dissipated.

In the embodiment shown, the trench 23 is about 30 μm wide and 6-7 μm deep. These dimensions are only exemplary and can be changed as desired, e.g. to accommodate for a larger amount of excess solder. It is recommended to keep the trench depth shallower, typically by 1-2 μm, than the lateral overgrowth thickness. In this case, the remaining layer of semi-insulating material at the bottom of the trench insulates the substrate from the solder and it is not necessary to cover the bottom and the sidewalls of the trench with an insulator. A deeper trench may also be utilized, provided that its bottom and sidewalls are coated with a conformal insulation layer, such as an SiN and/or SiO dielectric layer.

Figure 5:
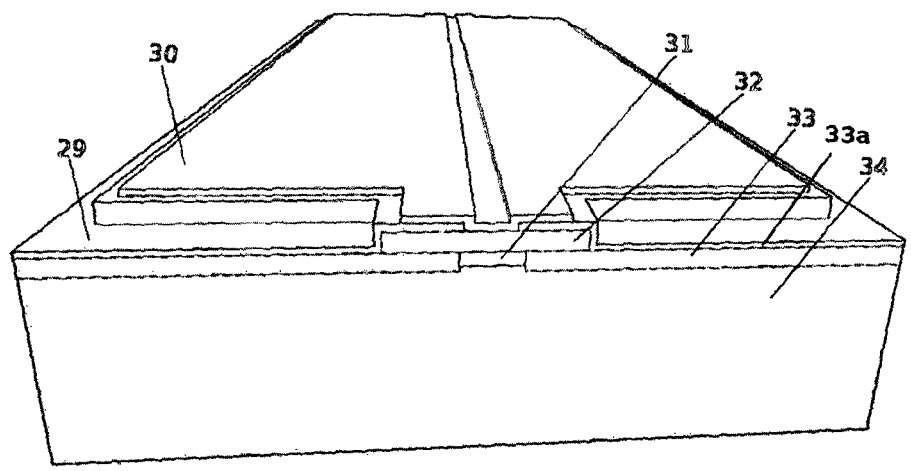

FIG. 5 shows a second embodiment of a laser optimized for epi-down mounting according to the present invention. It is an inverted BH QCL in which a trench has been etched all around the chip with the exception of the laser facets.

The BH QCL shown in FIG. 5 has an active region 31 with a top cladding 32, covered by an optional insulating layer 33a having an aperture over the ridge and, finally, a metallic contact layer 30 for current injection. The opposite contact, usually at the bottom of the substrate 34, is not shown. A semi-insulating lateral overgrowth or burying layer 33 provides for the waveguide.

The novel structural element according to the invention is the trench 29, serving as the desired receptacle for excessive solder. This trench 29 extends all around the chip with the exception of the laser facets.

In the case of this inverted BH QCL, the trench 29 is formed by completely etching away the electrically conductive cladding layer, the remainder of which is shown in the figure at 32. The semi-insulating material of the burying layer 33 provides electrical insulation to prevent shorts. Optionally, a conformal insulating coating 33a on top of the device and/or in the trenches my be deposited.

In the case of inverted BH, trenches have the additional benefit of removing electrical connection between adjacent devices, hence enabling to test each device of a laser bar individually. This is advantageous, for example, to pre-screen devices in bar form after defining facets or after the deposition of facet coatings, prior to singulation.

When such solder relief trenches were implemented, it was observed that the fraction of BH QCL devices which got shorted during epi-down bonding was minimzed, it actually approached zero.

Figure 6:
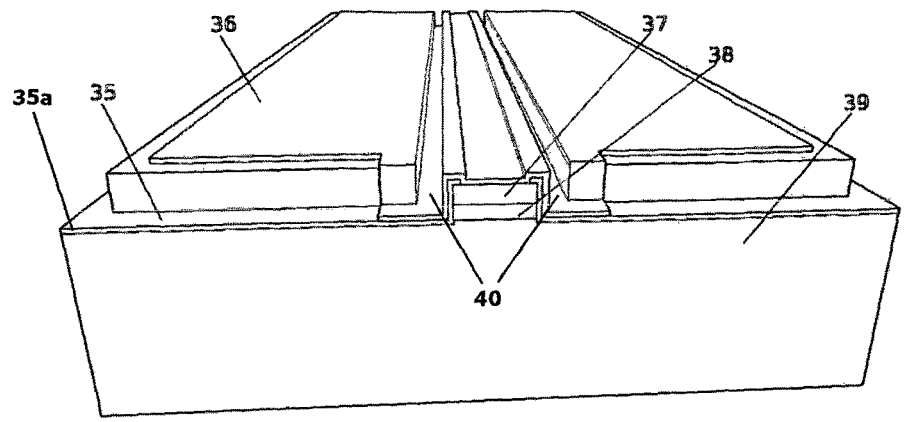

FIG. 6 shows a third embodiment, here a ridge-waveguide QCL, according to the present invention. Again, a trench has been etched all around the chip, with the exception of the waveguide facets, creating a relief space where excess molten solder can flow without risking to short the device. This QCL once more allows high-yield epi-down bonding in accordance with the present invention.

The RWG QCL shown in FIG. 6 has an active region 38 with a top cladding 37, covered by an optional insulating layer 35a having an aperture over the ridge and, finally, a metallic contact layer 36 for current injection. The opposite contact, usually at the bottom of the substrate 39, is not shown. Two channels 40 on either side of the active region 38 serve as waveguide delimiters.

As mentioned above, the top surface of the epitaxial side of the RWG QCL chip is covered by an electrically insulating layer 35 of dielectric material, such as SiN and/or SiO, which is only open on top of the active region for electrical contact. This insulating layer 35 is essential for RWG QCLs, because the unetched material on the sides of the active region 38 is conductive and connecting it would result in paramount leakage current. As for BH QCLs described above, the top surface also comprises a metallic contact 36 and an optional layer of heat-spreading material such as thick (typically 3-5 μm) electro-plated gold. According to the invention, a trench 35 is etched all around the chip, with the exception of the area of the two waveguide facets.

Contrary to the case of BH QCLs, it is not necessary to leave unetched material on the sides of the active region at the laser facet in RWG QCLs because the optical mode does not extend into it and it does not contribute significantly to heat dissipation. In the embodiment shown, a trench width of 30 μm and a depth of 6-7 μm was chosen. These dimensions are only exemplary and can be changed as desired, e.g. to accommodate for a larger volume of excess solder. In the case of RWG QCLs, it is critical to cover the trench bottom and sidewalls with an insulating conformal coating, such as a SiN and/or SiO dielectric layer.

In the preferred embodiment of epi-down optimized RWG QCLs, shown in FIG. 6, the depth of the solder relief trenches is equal to the depth of the two channels 40 forming the waveguide and they are all formed simultaneously in a single etch step. Furthermore, a single conformal coating 35a is used to insulate the bottom and sidewalls of the channels and of the trenches. In this embodiment, no additional processing step is required to implement the present invention, compared to the standard double-channel configuration.

QCLs chips processed in accordance to the present invention may, for instance, be mounted epi-down on aluminum nitride (AlN) submounts with vacuum-deposited gold-tin (AuSn) solder.

Although this description focuses on QCLs, the present invention may also be used with other types of edge-emitting semiconductor lasers, including but not limited to RWG Interband Cascade Lasers (ICLs) and RWG and BH diode lasers. Furthermore, it may also be used to improve the epi-down bonding fabrication yield of vertically emitting lasers such as vertical-cavity surface emitting lasers (VCSELs) and vertical-external-cavity surface emitting lasers (VECSELs) which emit light through the substrate. In the case of non-edge-emitting lasers, a solder relief trench may simply be etched uniformly all around the chip.

Figure 7:
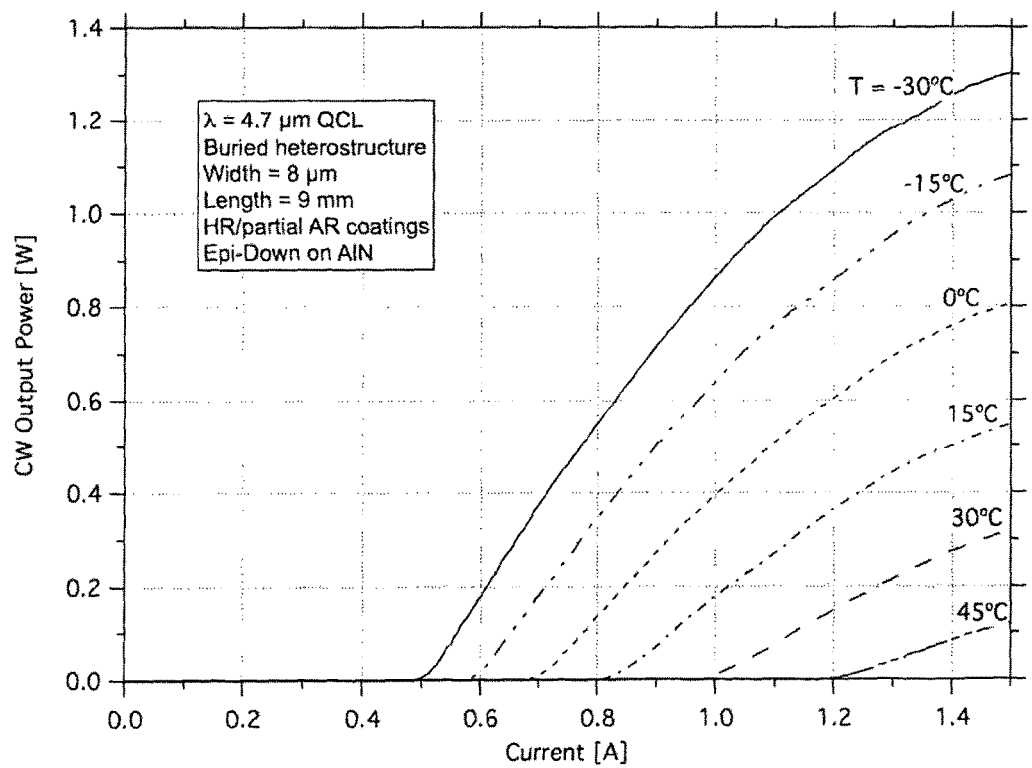

FIG. 7 shows measurements taken from a epi-down-mounted high-power quantum cascade laser, i.e. from an actual reduction to practice of the present invention. This QCL emits in the mid-infrared spectral range at a wavelength of 4.7 µm. Several devices of up to 9 mm length were mounted with high fabrication yield. A maximum CW output power of 1.3 W was observed. FIG. 7 shows measured optical power and voltage as function of current in such a device at different temperatures: voltage (left) and output power (right) are displayed as function of current in continuous-wave operation at temperatures ranging from −30° C. to +45° C. for a quantum cascade laser mounted epitaxial-side-down according to the present invention.

In conclusion, the presented novel device geometry, applicable to various QCLs and similar laser designs, does neither affect, especially reduce, laser performance nor die shear strength, but avoids the risk of short circuit during the epitaxial-side-down bonding process.

The invention claimed is:

1. A method of making a semiconductor buried-heterostructure quantum cascade laser chip (FIG. 4; FIG. 5) configured for epitaxial-side-down bonding, said chip comprising a substrate, an active region with two facets, a cladding, a burying layer, and a top electrode providing for current injection into said active region, wherein
   etching a trench extending, with the exception of a small section centered on each of the two facets of said active region, around the circumference of said chip at its outer edge,
   said trench having a cross-section, measured across the width of said chip, with a width of about 5-15% of the width of said chip and a depth of about 2-10% of the thickness of said chip.

2. The method according to claim 1, wherein
   the trench is etched into the cladding of the chip.

3. The method according to claim 1, wherein
   the trench is etched into the burying layer of the chip.

4. The method according to claim 1, wherein
   the substrate is made of InP, the active region is made of InGaAs and/or AlInAs, the cladding is made of doped InP or InGaAs or AlInAs, and the electrode consists of several layers, at least one of which is Au.

5. The method according to claim 1, further comprising providing an insulating layer conformally covering at least part of the bottom and the sidewalls of the trench, for insulating excess solder or other fastening agent from the chip.

6. The method according to claim 3, wherein
   the trench is etched to a depth of less than the thickness of the burying layer.

7. The method according to claim 1, wherein
   the trench is etched about 20-50 µm wide and about 4-10 µm deep.

8. The method according to claim 1, wherein
   the trench is etched to a depth larger than or equal to the thickness of the cladding, and smaller than or equal to the sum of the thicknesses of said cladding and the burying layer.

* * * * *